INTEGRATED CIRCUIT HAVING ACTIVE AND PASSIVE COMPONENTS IN SAME SEMICONDUCTOR REGION

Filed June 28, 1965

INVENTOR.
ISY HAAS
BY
Fleit & Swain
ATTORNEYS 3,363,154
Patented Jan. 9, 1968

3,363,154

INTEGRATED CIRCUIT HAVING ACTIVE AND PASSIVE COMPONENTS IN SAME SEMICONDUCTOR REGION

Isy Haas, Cupertino, Calif., assignor to Teledyne Inc., Hawthorne, Calif., a corporation of California Filed June 28, 1965, Ser. No. 467,290
1 Claim. (Cl. 317—235)

ABSTRACT OF THE DISCLOSURE

An integrated circuit includes a semiconductive island having a transistor and one or more resistors on the same island. The transistor is inset into a common substrate with a second transistor, the two transistors being coupled to form an inverter circuit where when one transistor is off the other is on. A resistor coupling the input of one transistor to the output of the other is located on the semiconductive region which forms the collector of one of the transistors.

This invention is directed to an integrated circuit, and more particularly to the type of integrated circuit where more than one component is placed on electrically the same semiconductive region of material.

In the integrated circuit art, one of the major cost factors of the circuit is its "packing density." Normally, it is necessary that each component of the circuit be isolated on its own individual semiconductive region formed in a common substrate. The region preferably interposes a rectifying junction between the components whereby to provide isolation of one from the other. The necessity in the prior art of the use of separate electrically isolated regions for every component thus decreases the density of the solid state components on the particular integrated circuit semiconductor substrate causing an attendant cost increase.

It is, therefore, a major object of the invention to provide an improved integrated circuit.

It is another object of the invention to provide an integrated circuit having improved packing density.

It is yet another object of the invention to provide an integrated circuit where an active component is placed on the same semiconductor island as a passive component.

These and other objects of the invention will become more clearly apparent from the following description when taken in conjunction with the accompanying drawing.

Referring to the drawing.

Figure 2:
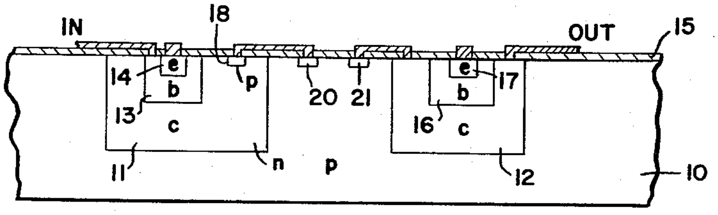
FIGURE 2 is a sectional view taken generally along the line 2—2 of FIGURE 1.

As best illustrated in FIGURE 2, the integrated circuit includes a semiconductive substrate of, for example, p-type material 10 which has two relatively large inset regions 11 and 12 of n-type material. The inset regions serve as semiconductor isolated islands in substrate 10 and also as the collectors for the two active transistor components of the integrated circuit. Inset region 11 contains a first planar type transistor comprising an inset base region 13 of p-type conductivity, and an emitter region 14 of n-type conductivity inset into region 13. Similarly, semiconductor region 12 includes a second planar type transistor comprising an inset base region 16 and an emitter region 17 of the appropriate conductivity types.

Figure 1:
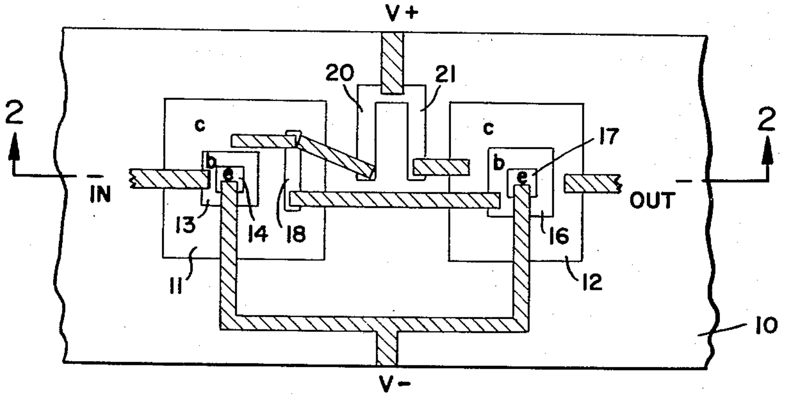
FIGURE 1 is a plan view of the device of the present invention.

In accordance with the invention, the inset region 11 also includes, in addition to the planar transistor, a passive component. The component is in the form of a resistor having a body of p-type material 18 inset into region 11. The top view of the integrated circuit thus far described is shown in FIGURE 1 with the various inset regions correspondingly numbered.

Semiconductive substrate 10 also contains a pair of inset resistors of n-type conductivity 20 and 21 which are joined together at one end to form a terminal for supply of the operating voltage, V+, through the resistors to the planar transistors of the integrated circuit. A common supply terminal is shown only for convenience in this particular application; in other circumstances a common V+ point need not be used.

Figure 3:
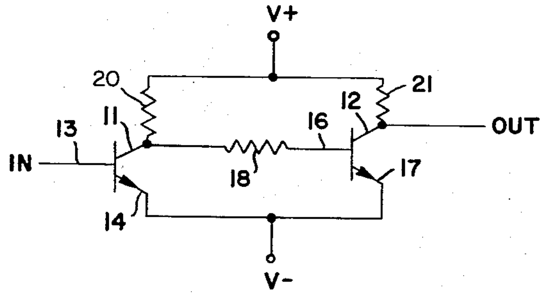
FIGURE 3 is a circuit schematic of the device of FIGURES 1 and 2.

FIGURE 3 schematically illustrates the connection of the components. Inset resistor 18 is coupled to the collector of input transistor including regions 11, 13, 14 and in turn, the resistor is coupled to the base of the output transistor including regions 12, 16, and 17. Resistors 20 and 21 are connected to the collectors of the transistors. The emitters 14 and 17 are coupled together to V— or ground. All of the ohmic connections are illustrated in FIGURE 1 by the cross-hatched portions of the integrated circuit. Normally, these connections are accomplished by means of aluminum thin films which are placed on the oxide protective layer 15 of the semiconductive substrate.

In operation, the circuit of FIGURE 3 functions as an inverter of the direct current transistor logic (DCTL) type; the inverter action occurs since the output transistor is always in an off condition when the input transistor is in an on condition and vice versa. Operation of the circuit is initiated by a positive input pulse or voltage (which is greater than 0.8 volts for a typical NPN transistor) to the base 13 of the input transistor. The forward bias applied between the emitter 14 and base 13 of the NPN device causes the transistor to turn "on" or be in a closed circuit condition to establish a conduction path between V+ and V— through resistor 20.

The conduction of the input transistor brings collector 11 down to V— potential along with base 16 of the output transistor to thus effectively place the output transistor in an open circuit or off condition. More particularly, the forward bias voltage between emitter 17 and base 16 is reduced to a very low value, typically below 0.1 volt, preventing conduction between collector 12 and the emitter 17. As the p-type resistor 18 will assume the same potential as the collector 11, no current flows in resistor 18. When the input transistor is turned on, the placing of resistor 18 in collector region 11 will thus not affect the operation of the circuit.

Discontinuation of the positive input pulse to the base 13 reduces the forward bias between the emitter 14 and base 13 to switch the input transistor into an open circuit or off condition. This in turn places collector lead 11 at a potential very close to V+ and when such potential is applied to base 16 through resistor 18, the forward bias voltage between emitter 17 and base 16 is increased to such a point as to cause the output transistor to conduct. During this on condition of the output transistor, collector region 11 floats at a potential determined by the ratio of resistors 20 and 18 and the base-emitter voltage at 16, as shown by the following formula.

$$V_{\text{at collector 11}} = -\frac{(V+ - V_{BE})}{R_{18}+R_{20}} \times R_{20} + V+$$

Figure 4:
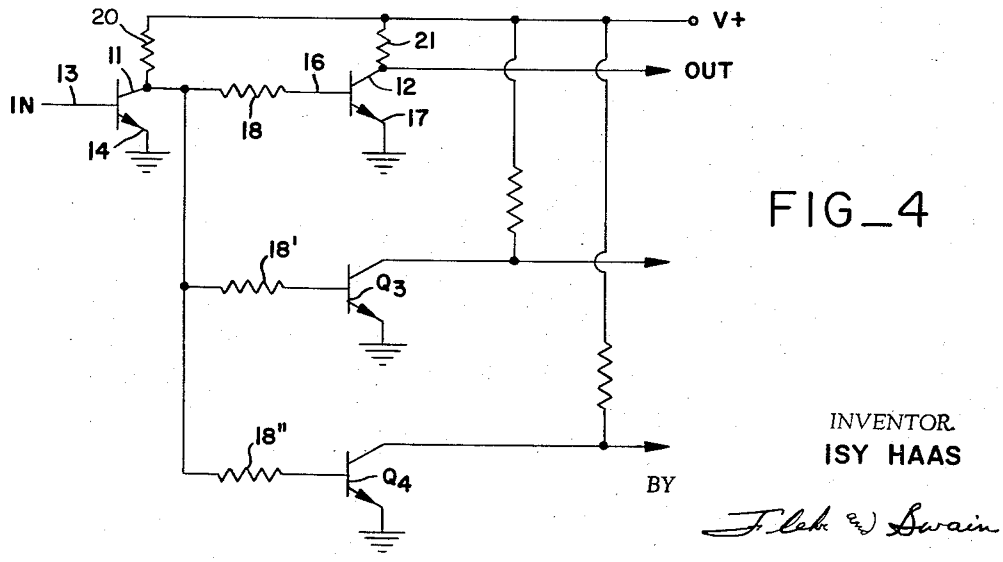
FIGURE 4 is a circuit schematic showing a modification of FIGURE 3.

While FIGURE 3 illustrates a simple two transistor inverter type logic circuit, more complex direct current transistor logic type circuits may be constructed embodying the invention. As shown in FIGURE 4, additional parallel output transistors Q3 and Q4 may be added to the circuit of FIGURE 3 with their respective base resistors 18' and 18'' diffused into collector region 11 along with resistor 18.

Thus, in summary, the use of a passive component, such as a resistor on the same semiconductor island as an active component in the type of circuit where one active component is off when the other is on, allows the integrated circuit to have a relatively higher packing density, therefore significantly reducing costs.

I claim:

1. An integrated circuit of the type having at least two active components inset into a semiconductive substrate, means coupling said two active components for always maintaining one of said active components in an off or open circuit condition during the on or closed circuit condition of the other active component and vice versa, said coupling means including at least one passive component, the improvement in such circuit comprising; a semiconductive substrate, a first semiconductive region of material of one conductivity type inset into said semiconductive substrate and forming a rectifying junction therewith said region containing two additional regions of opposed conductivity types inset into said first region and forming one of said active components, a region of opposite conductivity type inset into said first region and having two ohmic contact terminals and forming said passive component, one of said terminals being coupled to one of such regions forming said active component, a second semiconductive region of material of said one conductivity type inset into said semiconductive substrate and forming a rectifying junction therewith into said region containing two additional regions of opposed conductivity types inset into said second region to form another of said active components one of such two additional regions being coupled to the other of said terminals.

References Cited

UNITED STATES PATENTS

| | | | |
|---|---|---|---|
| 3,017,524 | 1/1962 | Koletsky et al. | 307—88.5 |
| 3,073,970 | 1/1963 | Bright | 307—88.5 |
| 3,173,028 | 3/1965 | Philips et al. | 307—88.5 |
| 3,211,972 | 10/1965 | Kilby et al. | 317—235 |
| 3,265,905 | 8/1966 | McNeil | 307—88.5 |

JOHN W. HUCKERT, *Primary Examiner.*

R. F. SANDLER, *Assistant Examiner.*